(12) United States Patent
Sanftleben et al.

(10) Patent No.: US 6,614,108 B1
(45) Date of Patent: Sep. 2, 2003

(54) ELECTRONIC PACKAGE AND METHOD THEREFOR

(75) Inventors: Henry M. Sanftleben, Carmel, IN (US); Derek S. Ferraro, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/692,886

(22) Filed: Oct. 23, 2000

(51) Int. Cl.[7] .............................................. H01L 23/10
(52) U.S. Cl. ..................... 257/710; 257/709; 257/704; 257/678; 257/687; 257/788; 257/789
(58) Field of Search .................. 257/709–710, 257/704, 678, 687, 788–789, 701, 711, 717, 787, 791, 795

(56) References Cited

U.S. PATENT DOCUMENTS

| | | | | |
|---|---|---|---|---|
| 5,028,984 A | * | 7/1991 | Ameen et al. | 357/72 |
| 5,230,759 A | * | 7/1993 | Hiraiwa | 156/69 |
| 5,268,814 A | * | 12/1993 | Yakubowski | 361/704 |
| 5,302,856 A | * | 4/1994 | Narita et al. | 257/788 |
| 5,349,240 A | * | 9/1994 | Narita et al. | 257/787 |
| 5,532,294 A | * | 7/1996 | Ikeno et al. | 523/212 |
| 6,265,480 B1 | * | 7/2001 | Enami et al. | 523/212 |

* cited by examiner

Primary Examiner—David E. Graybill
Assistant Examiner—Luan Thai
(74) Attorney, Agent, or Firm—Jimmy L. Funke

(57) ABSTRACT

An electronic package and a method for packaging an electronic component, particularly a shock-sensitive component such as a yaw rate sensor or an accelerometer mounted to a circuit board. The package includes a case having an opening through which the circuit board is placed within the case, so that a peripheral edge of the circuit board is adjacent but spaced apart from a wall of the case. A thixotropic gel is present in the space between the peripheral edge of the circuit board and the wall of the case, so as to separate and control the mechanical decoupling of the circuit board and case. An optional spacer can be used to space the circuit board from the shelf. Alternatively, the gel may be filled with a polymer particulate material. A potting material preferably fills an upper cavity within the case to encapsulate and secure the circuit board within the case.

18 Claims, 1 Drawing Sheet

ELECTRONIC PACKAGE AND METHOD THEREFOR

TECHNICAL FIELD

The present invention generally relates to packages and packaging methods for electronic components. More particularly, this invention relates to a package and method for protecting a shock-sensitive electronic component, such as motion sensors that include micromachined structures.

BACKGROUND OF THE INVENTION

Electronic packages are widely employed to protect electronic components from hazards posed by their intended operating environments, including heat, moisture condensation, chemical attack, vibration, shock, impact, etc. Notable examples are motion sensors, which include gyroscopes and their components (e.g., angular (yaw) rate sensors and accelerometers), used in aerospace and automotive safety control systems and navigational systems and in consumer goods such as VCR cameras. Examples of automotive applications include anti-lock braking systems (ABS), active suspension systems, supplemental inflatable restraint (SIR) systems such as air bags and seat belt lock-up systems, and crash sensing systems.

Yaw rate sensors of the type used in ABS and SIR systems are typically located in the passenger or engine compartment and employ one or more acceleration sensing elements, such as a micromachined structure formed in or on a silicon chip. The chip is typically mounted on a printed circuit board that is secured in an open case and sealed with a potting material that protects the circuit board, its sensing element, and any other components within the case from the hostile environment of the engine compartment. The vehicle manufacturer often specifies the environment and test requirements that the resulting package must survive. One such test is a 1 to 1.5 meter drop test performed on a completed package to verify that the package can withstand an accidental drop during vehicle installation. An additional requirement of the package is to faithfully and reliably transmit the acceleration of the case to the sensing element within the case. The desire for motion sensing packages to survive greater impacts has given rise to a conflict between the requirement to accurately transmit acceleration to the sensing element while also providing a degree of shock resistance, particularly in the case where the sensing element is a relatively fragile micromachined structure.

While existing packaging systems have proven to be extremely reliable in numerous applications, it would be desirable if an electronic package were available that further improved the shock resistance of an electronic component within the package, yet was capable of faithfully and reliably transmitting acceleration to the component, particularly when the component is a mechanical motion sensing element.

SUMMARY OF THE INVENTION

The present invention provides an electronic package and a method for packaging an electronic component, particularly a shock-sensitive component. Specific electronic components of interest are yaw rate sensors and accelerometers that are mounted to a circuit board and employ a mechanical motion sensing element, such as a micromachined structure. The package of this invention includes a case having an opening through which the circuit board is placed within the case, so that a peripheral edge of the circuit board is adjacent but spaced apart from a wall of the case. A thixotropic gel is deposited in the space between the peripheral edge of the circuit board and the wall of the case, preferably before the board is installed, so as to separate and to control the degree of mechanical decoupling of the circuit board to the case. As a result, the gel significantly reduces the amount of shock that the circuit board and its component(s) are subjected to during the sharp acceleration/deceleration associated with an impact (e.g., a dropped package during vehicle assembly).

In the method of this invention, placement of the gel and circuit board within the case is preferably facilitated by forming the wall of the case to define a shoulder and a surrounding wall portion that provide a receptacle for the gel along the wall of the case. The circuit board is then installed so that its peripheral edge contacts the gel, which spaces the circuit board from the shoulder and the wall portion. Also in the preferred embodiment, the circuit board defines two cavities within the case. A first of the cavities is defined between the board and the opening of the case, while the second is an enclosed cavity between the board and the case in which the electronic component is housed. An elastomeric material is deposited in the first cavity to encapsulate and secure the circuit board within the case. The thixotropic gel seals the board-case interface to prevent the elastomeric material from intruding into the second case.

As noted above, the package and packaging method of this invention are particularly suitable for protecting yaw rate sensors and accelerometers that employ a micromachined motion sensing element. According to the invention, the package provides improved shock resistance for a motion sensor within the case, yet enables acceleration and motion to be faithfully and reliably transmitted to the sensing element of the sensor. Suitable compositions for the thixotropic gel can be accurately dispensed in the case with minimal waste and subsequently cured at room temperature, thereby minimizing processing costs. An additional advantage is the flexibility of the packaging system in terms of the ability for the thixotropic gel to be used with cases of different shapes and sizes, avoiding the necessity for additional inventory requirements, tooling changes, capital investment and logistic costs that would be associated with the use of a preshaped material.

Other objects and advantages of this invention will be better appreciated from the following detailed description.

DESCRIPTION OF THE PREFERRED EMBODIMENT

Figure 1:
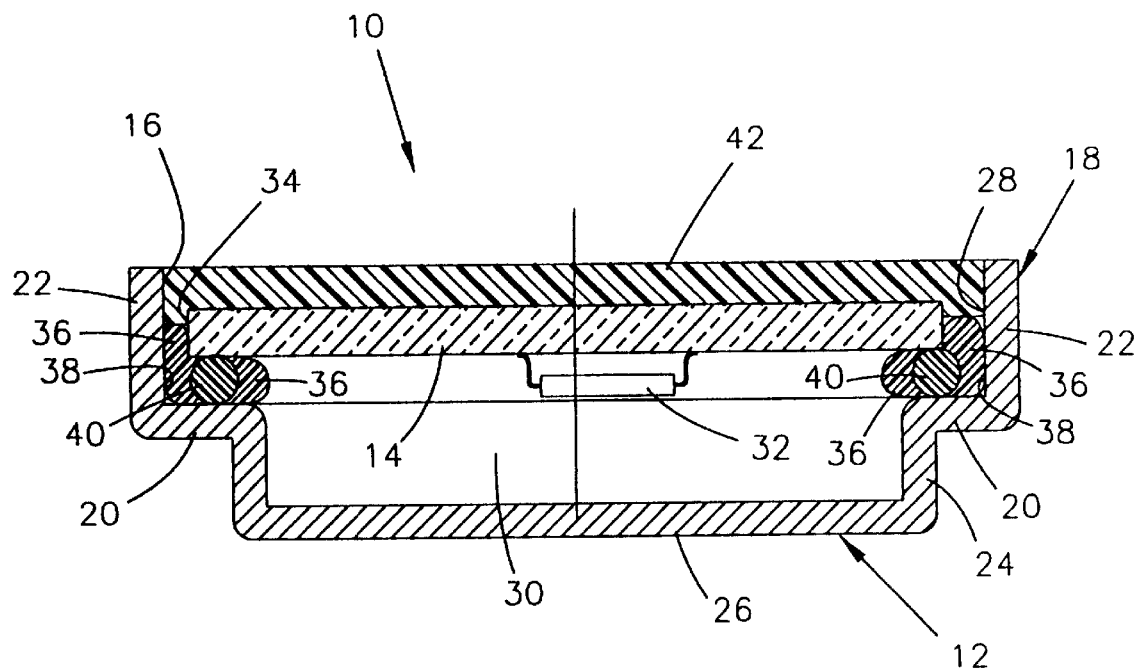
FIGS. 1 and 2 are cross-sectional views of electronic packages in accordance with different embodiments of this invention.
Figure 2:
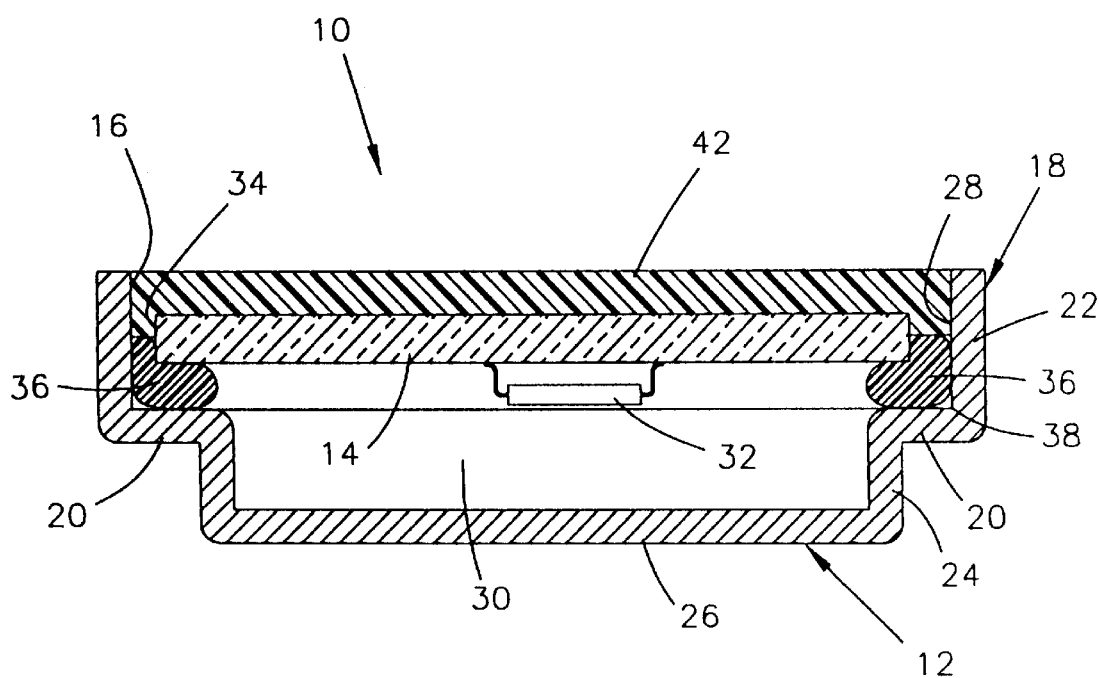

An electronic package 10 is shown in FIGS. 1 and 2 as generally including an open case 12 that supports a printed circuit board 14. The case 12 may be formed from any suitable structural material, such as a die-cast metal, though other materials such as engineering resins and E-coated steels may also be used. The circuit board 14 is shown as being positioned within the case 12 inward from an opening 16 to the case 12, so that the board 14 defines a cavity 28 within the case 12 adjacent the opening 16. The board 14 is also shown as being adjacent to a portion of the case wall 18 where a shelf or shoulder 20 is defined. Above the shoulder 20 (according to the orientation represented in FIGS. 1 and 2), the shoulder 20 is separated from the case opening 16 by an upper wall portion 22. Below the shoulder, the case 12 is defined by a lower wall portion 24 and a closed end 26. As a result, the circuit board 14 defines an enclosed cavity 30 within the case 12 with the lower wall portion 24 and the closed end 26 of the case 12. The enclosed cavity 30 may be evacuated or filled with dry air, another suitable gas, or a suitable fluid of a type known in the art.

The board 14 is represented as having an electronic component 32 mounted to its lower surface, so that the component 32 is protectively enclosed within the cavity 30. While the component 32 could be of any type mounted to the board 14, the benefits of this invention are particularly realized with motion sensors, including angular (yaw) rate sensors and accelerometers used in consumer goods and aerospace and automotive safety control systems and navigational systems, especially where the sensing element is a micromachined structure formed in or on a silicon chip mounted to the circuit board 14. To improve shock resistance without unacceptably degrading the transmission of acceleration and/or motion to the component 32, the board 14 is shown as being located within the case 12 so that its peripheral edge 34 is adjacent the shoulder 20 and upper wall portion 22 of the case 12, but separated from the shoulder 20 and wall portion 22 by a thixotropic gel 36 contained within a continuous cavity or recess 38 defined at the intersection of the shoulder 20 and wall portion 22 along the entire interior perimeter of the wall 18. FIG. 1 shows the package 10 as including an optional spacer 40 that controls the spacing between the circuit board 14 and the shoulder 20. The embodiment of FIG. 2 differs from that of FIG. 1 by omitting the spacer 40, with the option that the gel 36 may contain polymeric particles (not shown) of a sufficient size to achieve a minimum bond line. If the spacer 40 is included and in a continuous form, e.g., a sheet material, around the perimeter of the board 14, it also provides a mechanical slip plane that helps mechanically decouple the circuit board 14 from the case 12. A suitable elastomeric sheet material for the spacer 40 is a silicone rubber, a particularly suitable example being ASTM C1115 Type T or C, Hardness H4, Class F, Surface S1, available from a variety of commercial sources. It is foreseeable that other materials could be used as long as the material is compatible with the operating environment of the package and chemically compatible with the thixotropic gel 36.

According to the invention, the thixotropic gel 36 serves as a gasket that controls the degree of mechanical decoupling between the circuit board 14 and the case 12, thereby reducing the amount of shock that the component 32 would otherwise be subjected to as a result of a sharp acceleration applied to the case 12 from an impact or dropping. Design factors that influence the performance of the gel 36 include the spacing between the case 12 and board 14, the mass of the board 14, the mass and material of the case 12, the hardness, thickness and/or cross-section, and viscoelastic properties of the spacer 40 (if present), and the thickness and/or cross-section of the gel 36. While the degree of mechanical decoupling between the case 12 and board 14 is controlled by the gel 36, the amount of shock transferred to the circuit board 14 is controlled by a potting material 42, preferably a soft elastomer, that fills the upper cavity 28 and covers the circuit board 14. As a result, the potting material 42 seals the case 12 and securely retains the circuit board 14 within the case 12. A particularly suitable material for the potting material 42 is an addition-cured, platinum-catalyzed polydimethylsiloxane (PDMS) elastomer commercially available under the name 3-4207 Tough Gel® from Dow Corning. Tough Gel is a particularly desirable material for having a glass transition temperature below the operating temperature range for automotive applications ($-40°$ C. to $105°$ C.), as well as having desirable mechanical properties such as hardness of about 60 Shore 00, elastic elongation of about 250%, and a modulus of elasticity of about 60 psi (about 0.4 $N/mm^2$). However, it is foreseeable that other soft elastomeric materials could be used for the potting material 42 of this invention.

The general requirements of the gel 36 are low hardness and strength to allow the board 14 to move toward and away from the case 12, while remaining between the board 14 and case 12 to serve as a seal that prevents the potting material 42 from draining into the lower enclosed cavity 30 during assembly. Compositions capable of providing these properties are obtained by mixing a thixotropic particulate material in a gel-like media, such as a silicone gel, to yield a paste-like consistency. Suitable thixotropic materials include silica, talc, clay, polymeric flake and powder waxes, in addition to others. A preferred composition for the gel 36 is about 1 to about 10 weight percent of a fumed silica powder in a silicone gel, such as a two-part dimethyl silicone gel commercially available under the name 3-4155 FAST CURE DIELECTRIC GEL from Dow Corning, which cures in less than thirty minutes at room temperature, has a hardness of less than 5 Shore 00, and an operating temperature range of about $-40°$ C. to about $105°$ C.

In accordance with the embodiment shown in FIG. 2, the gel 36 can be modified to contain polymeric particles of a sufficient size to achieve a minimum bond line. A suitable particle size is about one millimeter, with a suitable range being about 0.9 to about 1.05 mm. A preferred polymer for particles in the preferred dimethyl silicone gel 36 is a fluorosilicone rubber having a hardness of less than 30 Shore A. The fluorosilicone rubber particles preferably constitute about 1 to about 10 weight percent of the combined gel 36 and particles. Fluorosilicone particles do not appreciably swell during the shelf-life of the preferred dimethyl silicone gel, and therefore would not affect the spacing between the case 12 and board 14. The polymer particles may be admixed directly into the thixotropic gel 36 prior to depositing the gel 36 on the shoulder 20 of the case, with the result that the particles are dispersed throughout the gel 36. Alternatively, the particles may be placed on the shoulder 20 and then covered by the gel 36.

The size of the thixotrop should be much less than the smallest spacing between the board 14 and the case 12, preferably by an order of magnitude of at least two. For example, a particle size of less than 0.02 mm is preferred for a clearance of about 2 mm between the case 12 and board 14. A particularly suitable thixotropic filler material is a fumed silica powder commercially available under the name CAB-O-SIL from the Cabot Corporation. Successfully used with this invention is CAB-O-SIL M-5, having an average particle size of about 0.2 to 0.3 micrometers and a surface area of about 200±25 $m^2/g$. The amount of fumed silica used will depend in part on the particle surface area, with higher surface areas (e.g., about 300±50 $m^2/g$) believed to allow for the use of as little as 1 weight percent filler, and lower surface areas (e.g., about 100 $m^2/g$) requiring up to about 10 weight percent filler. In contrast, if a coarser or ground silica is used, the amount of filler required is very dependent on particle size, and typically much higher. For example, it is foreseeable that 60 to 70 weight percent of a ground silica would be necessary to obtain the desired thixotropic property for the gel 36. However, fumed silica is preferred over ground silica as having less of an impact on the hardness of the gel 36.

Initially during processing, the thixotropic gel 36 has a paste-like consistency yet is sufficiently flowable to allow the gel 36 to be dispensed on the shoulder 20 of the case 12. As a result of curing, the gel 36 acquires the desired gel-like consistency that is sufficiently firm to behave as a gasket which, according to its thixotropic characteristic, flows when severely deformed. As a result of its thixotropic property, the gel 36 will not absorb or transmit impact energy to the board 14 during a high-g impact if it has an appropriate thickness and/or cross-section. Instead, the soft elastomeric potting material 42 controls the amount of shock transferred to the circuit board 14 (if the material 42 has an appropriate hardness and thickness/cross-section).

In an investigation leading to the present invention, sample packages were assembled and tested having an overall appearance similar to that shown in FIGS. 1 and 2. Each package protected a micromachined silicon accelerometer carried on a dual-inline package (DIP) mounted to a circuit board. The case of each package was aluminum die-cast alloy 413 with dimensions of about 80×90×21 mm, and the mass of each package was about 130 grams. The packages differed by the potting material (42 in FIGS. 1 and 2) used, and by the use of either screws to secure the circuit board to the case (per the prior art) or a solid elastomeric gasket or the thixotropic gel of this invention separating the board from the case.

In accordance with the above discussion, those packages assembled in accordance with this invention used 3-4207 Tough Gel® ("Tough Gel" in Table I) as the potting material 42, and the silica-filled two-part silicone gel described above as the thixotropic gel 36 ("Thixotropic Gel" in Table I). The silicone gel was prepared by mixing about 1.3 grams of Cab-O-Sil M5 silica powder with about 39 grams of each of the two components of the two-part silicone gel, resulting in the silica constituting about 3.2% of the thixotropic gel by weight. The gel 36 was dispensed in the form of 3 mm beads on the shoulders (20 in FIGS. 1 and 2) of the cases. The circuit boards were then positioned in their cases and their perimeters pressed into the gel 36, causing the gel 36 to be displaced and compressed, until a board-to-case spacing of about 1 mm was achieved. The gel 36 then underwent a room temperature cure.

Other packages were also assembled using Tough Gel as the potting material 42, but in combination with a 40 durometer silicone rubber per ASTM C115 Type T or C, Hardness H4, Class F, Surface S1 as a gasket ("Gasket" in Table I) between the boards and their cases. Finally, in place of the Tough Gel potting material, the circuit boards of the remaining prior art packages were secured to their cases with either screws ("Screws" in Table I) or a polybutadiene urethane potting material commercially available under the name UH510S from PD George. The UH510S potting material, disclosed in U.S. Pat. No. 5,608,028, contained about 10 weight percent of a cardanol-base epoxy novolac available under the name CARDOLITE NC-547® from Cardolite. Several percent by weight of silica was added to modify the viscosity of the UH510S potting material.

Summarized below are the g forces measured at the DIP within each package from a one-meter drop test that resulted in either a bottom impact (in the z-axis to impact the open end 16 of the case 12) or a side impact (in the x-axis to impact the wall 18 of the case 12).

TABLE I

| Package Description | Bottom (g's) | Side (g's) |
| --- | --- | --- |
| Tough Gel + Thixotropic Gel | 952 | 970 |
| Tough Gel + Gasket | 1259 | 1354 |
| UH510S + Gasket | 3794 | 4135 |
| UH510S + Screws | 4091 | 5576 |

The above data evidenced that the packages configured in accordance with this invention ("Tough Gel+Thixotropic Gel") performed far better than the prior art packages, with average g forces at the DIP's being reduced by a factor of about 4.5. The packages of this invention also performed better than those equipped with the same Tough Gel potting material but a gasket instead of the thixotropic gel of this invention, with g forces at the DIP's being reduced by about 24% for bottom (z-axis) impacts and by about 28% for side (x-axis) impacts. This latter comparison indicates the significance of mechanically decoupling the circuit boards and their cases with a thixotropic gel 36 in accordance with this invention.

In a second investigation, sample packages were again assembled that differed in the use of the UH510S material or the Tough Gel material ("Tough Gel" in Table II) as the potting material 42, and the use of screws ("Screws" in Table II), a gasket, or the thixotropic gel 36 of this invention ("Thixotropic Gel" in Table II). In this investigation, the ASTM C1115 silicone rubber spacer 40 shown in FIG. 1 and described above was included with those packages using the thixotropic gel 36 of this invention. The gaskets were formed of either the 40 durometer ASTM C115 silicone rubber sheet used in the first investigation ("ASTM Gasket" in Table II), or an elastomeric seal formed of a RTV silicone rubber available under the name 3-1744 RTV COATING® from Dow Corning and having a hardness of about Shore A 30 to 38 ("RTV Gasket" in Table II).

Summarized below are the minimum, maximum and average g forces measured at the DIP's from a one-meter bottom-impact drop test.

TABLE II

| Package Description | Min. | Max. | Avg. |
| --- | --- | --- | --- |
| Tough Gel + Thixotropic Gel + Spacer | 425 | 1714 | 999 |
| Tough Gel + ASTM Gasket | 902 | 1874 | 1316 |
| Tough Gel + RTV Seal | 1364 | 4632 | 2734 |
| UH510S + ASTM Gasket | 2006 | 4532 | 3779 |
| UH510S + Screws | 3099 | 8258 | 4634 |

The above data again evidenced that the packages configured in accordance with this invention ("Tough Gel+Thixotropic Gel+Spacer") performed far better than the prior art packages, reducing high impact shock transmission by about 24% as compared to those equipped with the same Tough Gel potting material but without the thixotropic gel of this invention. Again, this improvement indicates the importance of mechanically decoupling the circuit boards and their cases with a thixotropic gel 36 of this invention.

While the invention has been described in terms of a preferred embodiment, it is apparent that other forms could be adopted by one skilled in the art. For example, the invention is applicable to electronic packages that differ from that shown in FIGS. 1 and 2 and employ shock-sensitive components other than mechanical sensing elements. Furthermore, appropriate materials could be substituted for those suggested. Accordingly, the scope of the invention is to be limited only by the following claims.

What is claimed is:

1. An electronic package comprising:
   a case having an opening, a peripheral wall, and a second wall opposite the opening;
   a circuit board suspended within the case so that a peripheral edge of the circuit board is adjacent but spaced apart from the peripheral wall of the case, the circuit board defining an open cavity between the circuit board and the opening of the case and a closed cavity between the circuit board and the second wall of the case, the circuit board having an electronic component on a surface thereof, the component being enclosed within the closed cavity;
   a thixotropic gel between the peripheral edge of the circuit board and the peripheral wall of the case so as to mechanically decouple the circuit board and the case; and
   a potting mnaterial within the open cavity so as to cover the circuit board and seal the circuit board from the opening of the case, the potting material being formed of a material other than the thixotropic gel.

2. An electronic package according to claim 1, wherein the thixotropic gel comprises a silicone gel in which a silica powder is dispersed, the silica powder constituting about 1 to about 10 weight percent of the thixotropic gel.

3. An electronic package according to claim 2, wherein the thixotropic gel comprises a polymer particular material in an amount of about 1 to about 10 weight percent of the thixotropic gel.

4. An electronic package according to claim 1, further comprising an elastomeric spacer between and contacting the peripheral edge of the circuit board and the peripheral wall of the case so as to space the peripheral edge away from peripheral the wall, the elastomeric spacer being encapsulated by the thixotropic gel.

5. An electronic package according to claim 1, wherein the peripheral wall defines a shoulder and a wall portion surrounding the shoulder, the peripheral edge of the circuit board being spaced apart from the shoulder and the wall portion, the thixotropic gel being disposed within a receptacle defined by the shoulder and wall portion and disposed between the peripheral edge of the circuit board and the shoulder and the wall portion.

6. An electronic package according to claim 1, wherein the component comprises a motion-sensing micromachined structure.

7. An electronic package according to claim 1, wherein the closed cavity is filled with a dry gas.

8. An electronic package according to claim 1, wherein the potting material within the open cavity fills the open cavity and retains the circuit board within the case.

9. An electronic package comprising:
   a case having an opening and a wall that defines a shoulder and a wall portion that surrounds the shoulder and separates the shoulder from the opening, the shoulder and the wall portion defining a continuous receptacle along the wall;
   a circuit board within the case so that a peripheral edge of the circuit board is adjacent but spaced apart from the shoulder and the wall portion of the case, the circuit board defining a first cavity between the circuit board and the opening of the case and a second cavity between the circuit board and the ease, the circuit board having an electronic component on a surface thereof so that the component is within the second cavity;
   a thixotropic gel disposed within the receptacle defined by the shoulder and the wall portion so as to be between the peripheral edge of the circuit board and the shoulder and the wall portion of the case, the thixotropic gel consisting essentially of about 1 to about 10 weight percent of a fumed silica powder, about 1 to about 10 weight percent of a polymeric particulate material having a size of about 1 mm and a hardness of less than 30 Shore A, the balance a silicone gel; and
   an elastomeric material within the first cavity.

10. An electronic package according to claim 9, the electronic package further comprising an elastomeric spacer between and contacting the peripheral edge of the circuit board and the shoulder of the case so as to be encapsulated by the thixotropic gel and space the peripheral edge away from the shoulder.

11. An electronic package according to claim 9, wherein the second cavity is filled with a gas.

12. An electronic package according to claim 9, wherein the component comprises a motion-sensing micromachined structure.

13. An electronic package according to claim 9, wherein the elastomeric material within the first cavity fills the first cavity and retains the circuit board within the case.

14. A method comprising the steps of:
   providing a case having an opening, a peripheral wall, and a second wall opposite the opening;
   depositing a thixotropic gel on the peripheral wall of the case;
   placing a circuit board within the case, the circuit board defining an open cavity between the circuit board and the opening of the case and a closed cavity between the circuit board and the second wall of the case, a peripheral edge of the circuit board being adjacent but spaced apart from the peripheral wall of the case so that the thixotropic gel is between the peripheral edge of the circuit board and the peripheral wall of the case so as to mechanically decouple the circuit board and the case, the circuit board having an electronic component on a surface thereof that is disposed within the closed cavity, and then
   depositing a potting material within the open cavity so as to cover the circuit board and seal the circuit boad from the opening of the case, the potting material being formed of a material other than the thixotropic gel.

15. A method according to claim 14, wherein the thixotropic gel consists essentially of a silicone gel in which is dispersed about 1 to about 10 weight percent of a thixotropic particulate material and about 1 to about 10 weight percent of a polymeric particulate material having a size of about 1 mm and a hardness of less than 30 Shore A.

16. A method according to claim 14, wherein the thixotropic gel consists essentially of a silicone gel in which is dispersed about 1 to about 10 weight percent of a thixotropic particulate material, the method further comprising the step of providing an elastomeric spacer between and contacting the peripheral edge of the circuit board and the peripheral wall of the case so as to space the peripheral edge away from the peripheral wall, the elastomeric spacer being encapsulated by the thixotropic gel.

17. A method according to claim 14, wherein the peripheral wall of the case is formed to define a shoulder and a wall portion surrounding the shoulder, the thixotropic gel being disposed within a receptacle defined by the shoulder and wall portion and being disposed between the peripheral edge of the circuit board and the shoulder and the wall portion.

18. A method according to claim 14, wherein the potting material fills the open cavity as a result of the step of depositing the potting material within the first cavity.

* * * * *